(12) United States Patent
Cordero et al.

(10) Patent No.: US 8,874,979 B2
(45) Date of Patent: Oct. 28, 2014

(54) THREE DIMENSIONAL(3D) MEMORY DEVICE SPARING

(75) Inventors: Edgar R. Cordero, Round Rock, TX (US); Anil B. Lingambudi, Bangalore (IN); Saravanan Sethuraman, Bangalore (IN); Kenneth L. Wright, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 13/523,195

(22) Filed: Jun. 14, 2012

(65) Prior Publication Data

US 2013/0339821 A1    Dec. 19, 2013

(51) Int. Cl.
| G11C 29/00 | (2006.01) |
| G11C 29/44 | (2006.01) |
| G06F 11/10 | (2006.01) |
| H03M 13/05 | (2006.01) |

(52) U.S. Cl.
CPC ........ G11C 29/4401 (2013.01); G06F 11/1072 (2013.01); G06F 11/1048 (2013.01); H03M 13/05 (2013.01)
USPC .......................................... 714/711; 714/773

(58) Field of Classification Search
None
See application file for complete search history.

(56) References Cited

U.S. PATENT DOCUMENTS

| 5,414,637 | A | 5/1995 | Bertin et al. |
| 5,946,545 | A | 8/1999 | Bertin et al. |
| 6,512,708 | B1 | 1/2003 | Hsuan et al. |
| 6,573,524 | B2 | 6/2003 | Ho |
| 7,379,316 | B2 | 5/2008 | Rajan |
| 7,477,522 | B2 * | 1/2009 | Hazelzet ........................ 361/760 |
| 7,599,205 | B2 * | 10/2009 | Rajan .............................. 365/63 |
| 7,796,446 | B2 | 9/2010 | Ruckerbauer et al. |
| 7,870,459 | B2 * | 1/2011 | Hazelzet ........................ 714/753 |
| 7,929,368 | B2 | 4/2011 | Jeddeloh |
| 7,936,622 | B2 | 5/2011 | Li et al. |
| 7,944,047 | B2 | 5/2011 | Oh et al. |
| 7,984,355 | B2 * | 7/2011 | Djordjevic .................... 714/746 |
| 8,032,804 | B2 | 10/2011 | Jeddeloh |
| 8,040,745 | B2 | 10/2011 | Shibata |
| 8,060,774 | B2 | 11/2011 | Smith et al. |
| 8,063,491 | B2 | 11/2011 | Hargan |
| 8,750,010 | B2 * | 6/2014 | Hofstra .......................... 365/51 |
| 2007/0058410 | A1 | 3/2007 | Rajan |
| 2007/0058471 | A1 | 3/2007 | Rajan et al. |
| 2010/0110745 | A1 | 5/2010 | Jeddeloh et al. |
| 2011/0169522 | A1 | 7/2011 | Raj et al. |
| 2012/0185753 | A1 * | 7/2012 | Chen et al. .................... 714/773 |
| 2013/0275823 | A1 * | 10/2013 | Cordero et al. ............... 714/718 |
| 2013/0294140 | A1 * | 11/2013 | Oh et al. ......................... 365/96 |
| 2013/0294184 | A1 * | 11/2013 | Yang et al. .................... 365/200 |

* cited by examiner

*Primary Examiner* — Daniel McMahon
(74) *Attorney, Agent, or Firm* — Cantor Colburn LLP

(57) ABSTRACT

According to one embodiment of the present invention, a method for bank sparing in a 3D memory device that includes detecting, by a memory controller, a first error in the 3D memory device and detecting a second error in a first element in a first rank of the 3D memory device, wherein the first element in the first rank has an associated first chip select. The method also includes sending a command to the 3D memory device to set mode registers in a master logic portion of the 3D memory device that enable a second element to receive communications directed to the first element and wherein the second element is in a second rank of the 3D memory device, wherein the first element and second element are each either a bank or a bank group that comprise a plurality of chips.

20 Claims, 5 Drawing Sheets

THREE DIMENSIONAL(3D) MEMORY DEVICE SPARING

BACKGROUND

The present invention relates generally to computer memory, and more particularly to provide memory sparing for a memory system.

Computer systems often require a considerable amount of high speed random access memory (RAM) to hold information, such as data and programs, temporarily when a computer is powered and operational. This information is normally binary, composed of patterns of 1's and 0's known as bits of data. The bits of data are often grouped and organized at a higher level. A byte, for example, is typically composed of 8 bits; more generally these groups or bytes are called symbols and may consist of any number of bits or sub-symbols.

Memory device densities have continued to grow as computer systems have become more powerful. Currently it is not uncommon to have the RAM content of a single computer be composed of hundreds of trillions of bits. Unfortunately, the failure of just a portion of a single RAM device can cause the entire computer system to fail. When memory errors occur, which may be "hard" (repeating) or "soft" (one-time or intermittent) failures, these failures may occur as single cell, multi-bit, full chip or full memory module failures and all or part of the system RAM may be unusable until it is repaired. Repair turn-around-times can be hours or even days, which can have a substantial impact to a business dependent on the computer systems.

The probability of encountering a RAM failure during normal operations has continued to increase as the amount of memory storage in contemporary computers continues to grow.

Techniques to detect and correct bit errors have evolved into an elaborate science over the past several decades. These error detection and error correction techniques are commonly used to restore data to its original/correct form in noisy communication transmission media or for storage media where there is a finite probability of data errors due to the physical characteristics of the device. Memory devices generally store data as voltage levels representing a 1 or a 0 in RAM and are subject to both device failure and state changes due to high energy cosmic rays and alpha particles.

A group of memory chips or dies in a memory device (e.g., Dynamic random-access memory or DRAM), referred to as a rank, are positioned adjacent one another on a layer of the memory device. In some cases, a single memory error may be identified and corrected by code in the memory system, while multiple errors or failures at a selected point in time may not be identified and corrected, as error correction systems are unable to detect and/or correct more than one error at a time. Accordingly, in some cases when one or more chips of the rank fail or experience an error, the entire rank is taken offline or disabled to prevent the memory failures in that rank from adversely affecting system performance.

SUMMARY

According to one embodiment of the present invention, a method for bank sparing in a three dimensional (3D) memory device having a plurality of ranks is provided with each rank having a plurality of banks, the method including detecting, by a memory controller, a first error in the 3D memory device and detecting, by the memory controller, a second error in a first element in a first rank of the 3D memory device, wherein the first element in the first rank has an associated first chip select. The method also includes sending a command from the memory controller to the 3D memory device to set mode registers in a master logic portion of the 3D memory device that enable a second element to receive communications directed to the first element and wherein the second element is in a second rank of the 3D memory device, wherein the first element and second element are each either a bank or a bank group that comprise a plurality of chips and correcting the first error using an error control code.

According to one embodiment of the present invention, a computer program product for operating a 3D memory device having a plurality of ranks, each rank having a plurality of elements is provided where the computer program product includes a tangible storage medium readable by a processing circuit and storing instructions for execution by the processing circuit for performing a method. The method includes detecting an error in the 3D memory device during run time operation, the error being in a first element in a first rank of the 3D memory device, wherein the first element has an associated first chip select and identifying a second element in a second rank of the 3D memory device, the second element being properly operating. The method also includes sending a command from a memory controller to the 3D memory device during run time operation to set mode registers in a master logic portion of the 3D memory device that enable the second element to receive communications directed to the first element, wherein the first element and second element are each either a bank or a bank group including a plurality of chips.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
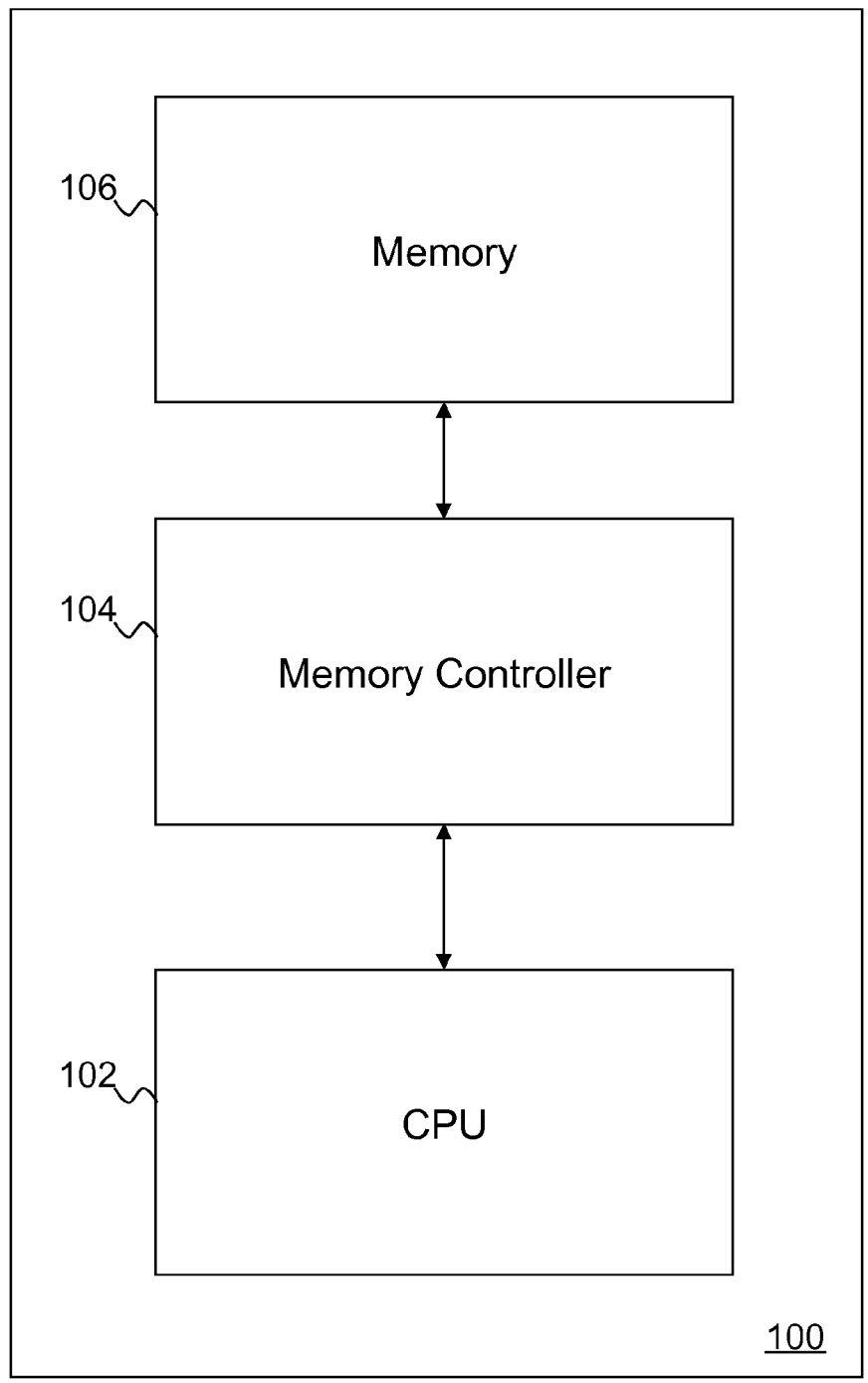
FIG. 1 illustrates a block diagram of a system for storing and retrieving data in a memory in accordance with an embodiment.

An embodiment is directed to configuring memory chips in a stack of chip layers that form a three dimensional (3D) memory device. In an embodiment, a logic, system and/or method is used to control the use of chips in the 3D memory device. Embodiments may perform such tasks as rank sparing control, chip select remapping and powering down by a suitable technique utilizing software, hardware and/or firmware. An exemplary system uses per dynamic random access memory (DRAM) addressability (PDA) in order to specify Mode Register Set (MRS) commands to individual chips within a rank or traditional MRS commands to address all chips of ranks simultaneously. In an embodiment, the stack of chips are coupled and/or connected using suitable conductors, such as through silicon vias (TSV). In embodiments, a spare bank or bank group is activated in order to have the server system continue operation after a soft or hard error in the memory without any disruption. In embodiments, communication for sparing happens through extra MRS commands.

A master logic portion, layer or chip may be used to control chips on other layers or ranks of the memory device, where chips in the other layers are referred to as slave chips. An embodiment of the sparing logic and method is part of a master logic in 3D DRAM chips. The ranks are made up of banks or groups of banks, where each bank includes a chip (e.g., DRAM chip). The groups of banks may include a plurality of banks, such as two, four or six banks. In an embodiment, the MRS commands sent to the TSV stack of chips tell both the master logic as well as the slave chips which banks or bank groups to enable and disable as well as sparring or chip select mapping that is desired. Depending on the configuration of the 3D memory device the rank may be made up of banks or bank groups, where the bank groups include a plurality of banks. The sparing and memory management methods and systems described herein apply to both bank sparing and bank group sparing. Accordingly, embodiments directed to banks may apply to bank groups and, similarly, embodiments directed to bank groups may apply to banks.

For example, bank group architecture may be a configuration preferred by some applications as opposed to independent bank usage. In an embodiment, bank grouping is independent of other bank groups within the same DRAM chip or layer as compared to banks within a bank group. As a result, in the memory architecture using bank grouping, each bank group command (e.g., read, write or refresh) will not be grouped with other bank's action state of a relationship. For example, if you select bank 0 of bank group 0 and do a write, read, refresh or any other operation, it will not affect the state of bank 0 of bank group 1.

The next generation DDR SDRAM (DDR4 and beyond) is a high-speed dynamic random-access memory internally configured as sixteen-banks, 4 bank group with 4 banks for each bank group for x4/x8 and eight-banks, 2 bank group with 4 banks for each bankgroup for x16 DRAM. Accordingly, embodiments with the bank grouping configuration bring an extra level of multiplexing to memory operation. In addition, the bank grouping improves the efficiency and overall memory bandwidth.

In one embodiment, a TSV stack has five layers of chips or ranks. Associated with the five ranks are four addressable chip selects. Each of these chip selects communicates, and is associated, with one or more configured or default chip. The fifth rank or chip layer (also called "die") is used as a spare and does not have a chip select associated with it that is addressable by a memory controller. In an example, this rank, since it is not being actively used, is placed in a low power mode. In an embodiment, if an error is detected on a bank or bank group on one of the non-spare ranks (i.e., ranks other than the spare rank), the memory controller can choose to invoke a replacement bank or bank group on the spare rank. The spare rank is then powered up and ready to be activated. The memory controller would then send MRS commands to select the spare bank or bank group to take the place of the faulty bank or bank group by reassigning the failed bank or bank group's chip select to the spare chip. By using the PDA (Per DRAM Addressability) function of the DDR4 memory, only the target stack is sent the MRS commands and the other TSV stacks are not affected. In embodiments, the PDA provides the ability to direct commands that can address banks in the stack separately, by which a failed bank in the target stack can be identified to swap with a spare bank. Once the failed bank or bank group has been replaced by the spare bank or bank group, it can then be then put in a low power mode in order to conserve power.

In another embodiment, a TSV 3D memory device has no spare chips or ranks. For example, four layers of chips make up the TSV stack of the 3D memory device. In this case, all of the ranks are assigned to the associated chip select and all are being actively used by the system. If there is an issue (e.g., failure or error) with a first bank or bank group in a rank in the TSV stack, that rank may be left unused for fear of data corruption or excessive errors with continued use of the rank. For example, the rank may be de-configured due to repeated errors or multiple errors experienced by first bank or bank group in the rank. If a second bank or bank group in the de-configured rank is properly functioning, the second bank or bank group, since this rank will no longer be accessed during normal operation, may then redeployed as a spare bank or bank group.

In one embodiment, an exemplary dual in-line memory module (DIMM) has four ranks. Each TSV component of the DIMM has four chip layers and therefore each chip of the TSV stack is associated with a rank on the DIMM and a chip select in the system. Each rank includes a plurality of banks or bank groups. The banks or bank groups may be referred to as elements for sparing purposes. For example, in a DIMM that includes a system Rank 0, which corresponds to a chip which has been assigned chip select 0 in the TSV stack, experiences errors that cause Rank 0 to be de-configured in the system. If the errors were not associated with selected banks or banks mapped to chip select 0 of a particular TSV stack, then that selected bank or bank group may then be redeployed to serve as a spare bank or bank group for the 3D memory device. The spare bank or bank groups may be assigned as the need arises, such as if a bank or bank group assigned to chip select 2 fails or has errors, in which case the memory controller may then control the master logic chip to invoke the spare bank or bank group mapped to the failed bank or bank group in chip select 0 and remap it to respond to requests or communications directed to the replacement bank or bank group in chip select 2. Thus, the arrangement enables the spare bank or bank group to receive communications in place of the failed bank or bank group.

In one embodiment, bank or bank group sparing can be done in the same manner as the MPR patterns are loaded into the DRAM. Bit MRS3 is defined as '0'—normal operation and '1'—dataflow to TSV master logic. Once in the mode of normal operation to TSV master logic, bank address bits A2, A1 and A0 are used to select the sparing and state configuration mode register in the TSV master logic. These registers control which banks or bank groups are available to be used as opposed to powered off as well as the chip select mapping as selected by the memory controller. One embodiment of the detailed flow of the protocol is shown in an exemplary flow chart described below.

One additional aspect is that once the DRAM has been put in the dataflow mode to TSV, reads can also be performed in order to verify that chosen spares, chip select mapping and power states are in the states desired by the memory controller and that the commands were received correctly. This reading mechanism may also be used to interrogate the TSV stack so as to inquire about the availability of spares or power saving state of DRAM in that stack.

In some cases, codes may be used to detect and correct errors in words communicated to or from the memory device. For example, memory error correction codes (also referred to as "error control codes" or "ECCs") use a combination of parity checks in various bit positions of the data word to allow detection and correction of errors. Every time data words are written into memory, these parity checks are generated and stored with the data. Upon retrieval of the data, a decoder can use the parity bits thus generated together with the data message in order to determine whether there was an error and to proceed with error correction if feasible. In some cases, more than one error may occur at a time, where the ECC is not able to detect and correct all of the errors. Embodiments of the memory system and method for operation of a memory system provide for sparing to enable memory operation after occurrence of errors.

FIG. 1 illustrates a block diagram of a system for storing and retrieving data in a memory in accordance with an embodiment. A system 100 depicted in FIG. 1 includes a computer processor 102, a memory 106 having memory cells, and a memory controller 104 for receiving data from the computer processor 102 to be stored in the memory 106. In an embodiment, the memory cells are arranged into pages, and pages are arranged into blocks. Thus, a block may contain a plurality of pages, each page containing a plurality of memory cells.

In one embodiment the memory controller 104 is coupled to the computer processor 102 and receives write requests from the computer processor 102. The write requests contain data to be written to the memory 106 and a logical address for identifying the location in the memory 106 to which the data will be written. The memory controller 104 stores data at a physical address within the memory 106. In an embodiment, the memory controller 104 maps the logic address to a physical address in the memory 106 when storing or retrieving data. The physical address for a given logical address may change each time data in the memory 106 is modified.

The system 100 is one example of a configuration that may be utilized to perform the processing described herein. Although the system 100 has been depicted with only a single memory 106, memory controller 104, and computer processor 102, it will be understood that other embodiments would also operate in other systems with two or more of the memory 106, memory controller 104, or computer processor 102. In an embodiment, the memory 106, memory controller 104, and computer processor 102 are not located within the same computer. For example, the memory 106 and memory controller 104 may be located in one physical location (e.g., on a memory module) while the computer processor 102 is located in another physical location (e.g., the computer processor 102 accesses the memory controller 104 via a network). In addition, portions of the processing described herein may span one or more of the memory 106, memory controller 104, and computer processor 102.

Figure 2:
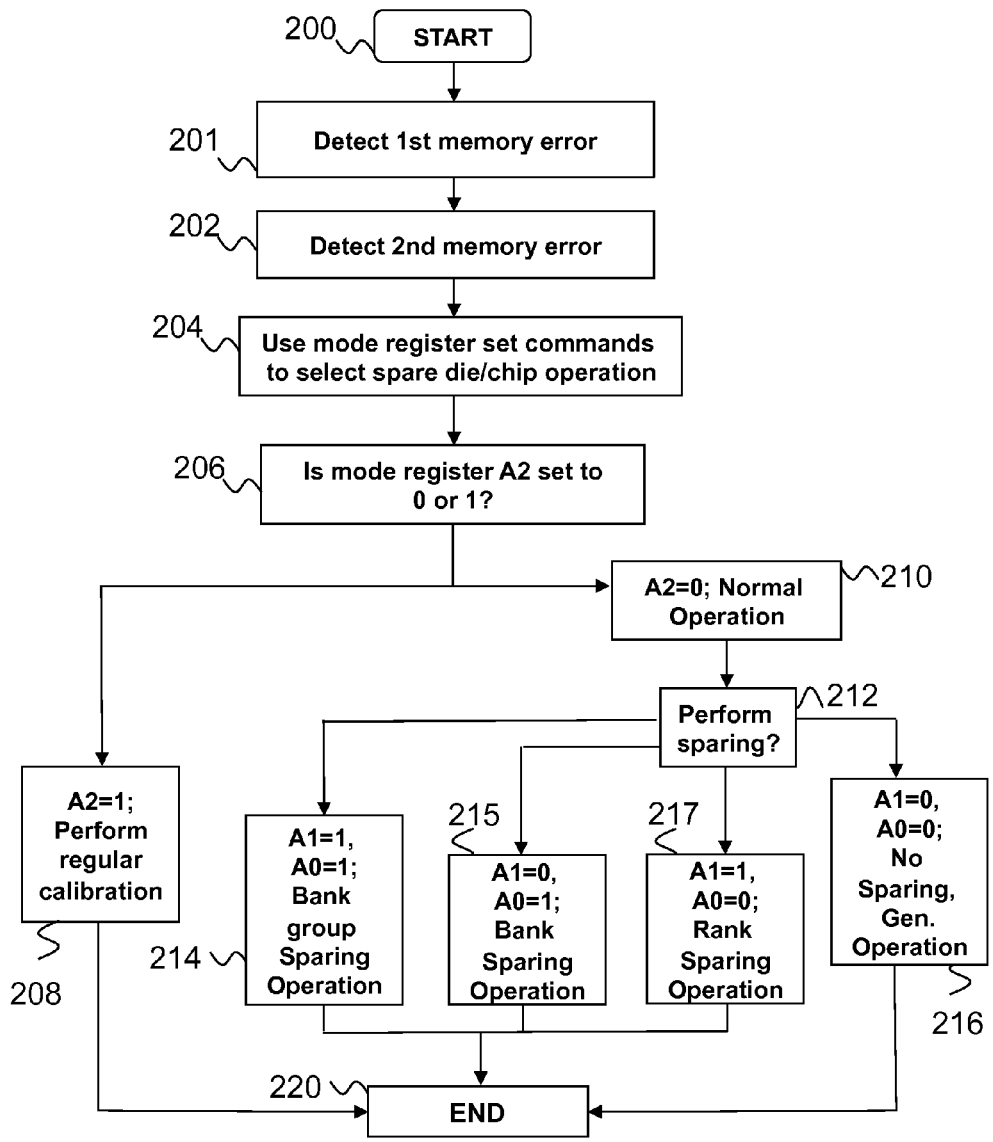
FIG. 2 illustrates a flow diagram of a method for operating a memory system that provides sparing for a memory device in accordance with an embodiment.

FIG. 2 is a flow chart of an exemplary method for operating a memory system that provides sparing of banks or bank groups in a memory device. The depicted blocks may be part of or in addition to another process and/or may be performed in any suitable order to provide bank or bank group sparing for a memory device. In an embodiment, commands for the blocks are performed by a memory controller. In block 200, the method is started, where the memory system is operating and communication with a processor or computing system. In block 201, the memory system detects a first error in the memory device. The error may be corrected as part of block 201 or may be corrected later, as depicted in the chart. In an embodiment, an ECC process may be used to detect and correct the error. In block 202, a second error is detected in a bank or bank group of the memory device. The second error may be detected by any suitable method, such as by verifying parity bits and/or ECC. In an embodiment, the second error may be detected through a scrub engine that runs in the background. In block 204, mode register set (MRS) commands are used to select the sparing operation for a bank or bank group of the memory device. In block 206, a value for a selected mode register is determined, where the value indicates if the memory device is in a normal operation mode. For example, the value of mode register A2 in mode register set 3 (MRS3) may either be a 0 or 1 to indicate normal operation or calibration, respectively. In block 208, normal operation and, consequently, sparing, is not available as mode register A2 has a value of 1. Further, the value of 1 indicates that a calibration is being performed on the memory device.

In block 210, the value of mode register A2 is 0, thus indicating normal operation of the device. In block 212, the value of mode registers A1 and A0 are determined to indicate if the sparing operation is enabled. In block 216, the value of A1 is 0 and A2 is 0 meaning that sparing is disabled and general operation for the mode registers occurs. Sparing may be disabled due to various factors, such as lack of spare chips or the entire chip stack is failed. In block 214, sparing of bank groups in the memory device is enabled and initiated as the value of A1 is 1 and A0 is 1. Accordingly, bank group sparing is enabled in a memory device architecture that supports bank groups, such as DDR4. In block 215, sparing of banks in the memory device is enabled and initiated as the value of A1 is 0 and A0 is 1. Bank sparing is enabled in a memory device architecture that supports bank groups, such as DDR3. In block 217, sparing of ranks in the memory device is enabled and initiated as the value of A1 is 1 and A0 is 0. Rank sparing may be offered as an alternative to bank sparing. In embodiments, bank sparing provides more flexibility than rank sparing. In an embodiment, the bank or bank group where the second error is detected (block 202) is the failed bank or bank group that is corrected or fixed by the sparing operation. In embodiments, the first error from block 201 is corrected by the ECC process while the sparing operation is used to correct the second error. In block 220, the sparing operation for the memory device is ended.

Figure 3:
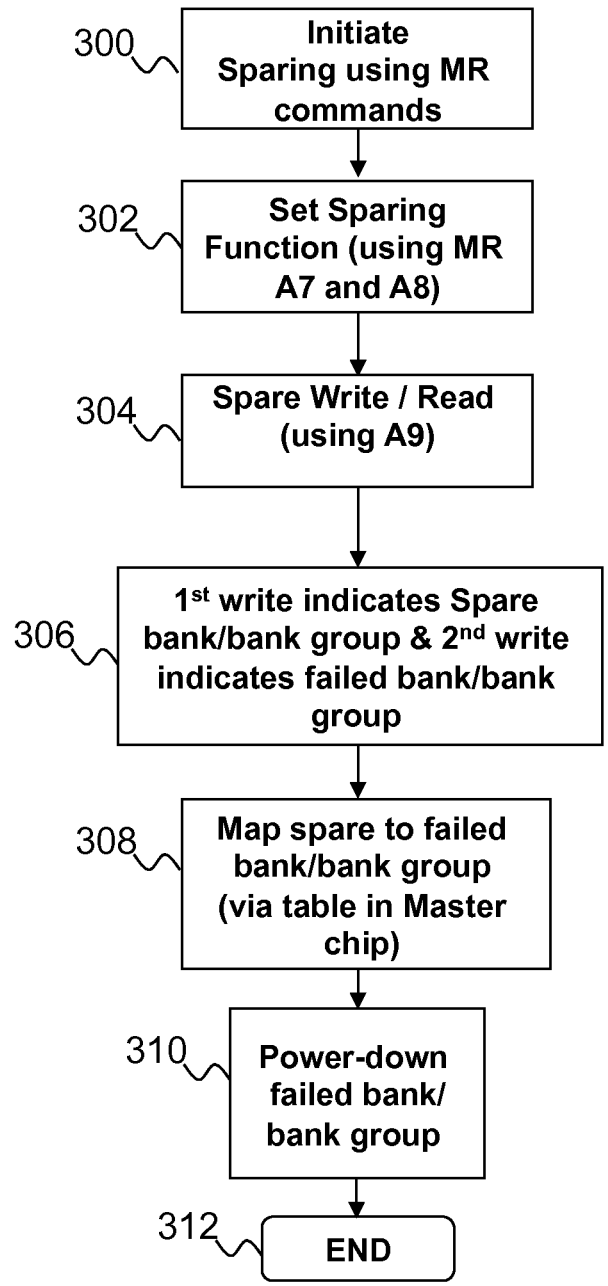
FIG. 3 illustrates a flow diagram of a method for operating a memory system that provides sparing for a memory device in accordance with an embodiment.

FIG. 3 is a flow chart of an exemplary method for sparing of chips in a memory device. The depicted blocks may be part of or in addition to another process and/or may be performed in any suitable order to provide chip sparing for a memory device. For example, the depicted blocks may be performed as part of the block 214 of the memory operation shown in FIG. 2 by a memory controller. In block 300, the sparing operation is initiated using mode register (MR) commands. In an embodiment, the sparing operation is initiated by setting selected values for mode registers A0, A1 and A2 of mode register set 3, as shown in the following table.

TABLE 1

| A2 | A1 | A0 | Description |
|---|---|---|---|
| 0 | 0 | 0 | Normal operation |
| 0 | 0 | 1 | Normal operation with Bank sparing |
| 0 | 1 | 1 | Normal operation with Bank Group sparing |
| 0 | 1 | 0 | Normal operation with Rank sparing |

TABLE 1-continued

| A2 | A1 | A0 | Description |
|----|----|----|-------------|
| 1  | X  | X  | Data flow with MPR pattern |

In block 302, the sparing function is set using mode registers A7 and A8 of mode register set 3. Values of A7 and A8 may be used to set the sparing function to normal operation, sparing, power up or power down, as shown in the following table. In an embodiment, a spare chip is powered up as a step of the sparing operation before it is mapped to replace a failed chip. Further, the failed chip may be powered down after the mapping to reduce power consumption.

TABLE 2

| A8 | A7 | Sparing function |
|----|----|------------------|
| 0  | 0  | Normal operation |
| 0  | 1  | Sparing          |
| 1  | 0  | Power up         |
| 1  | 1  | Power down       |

In block 304, the write or read command is set to a value for mode register A9. For example, a value of 0 for A9 is a spare read command and a value of 1 is a spare write command. In block 306, a first write indicates the spare (new) bank or bank group and a second write indicates the failed bank or bank group having the error, where the failed bank or bank group may be taken offline. In one embodiment, the first write uses a selected number of binary values to indicate the spare bank or bank group. In addition, the second write uses a selected number of binary values to indicate the failed bank or bank group. In block 308, the spare bank or bank group is mapped to the failed chip in a master chip of the memory system or module. In an embodiment, the mapping is provided by one or more tables in the master chip. For example, the table below shows values to indicate the spare chip for the blocks. The exemplary table shows only up to Bank 7, but may support multiple banks to support the future memory architectures.

TABLE 3

| S7 | S6 | S5 | S4 | S3 | S2 | S1 | S0 | Chip Select |
|----|----|----|----|----|----|----|----|-------------|
| 0  | 0  | 0  | 0  | 0  | 0  | 0  | 0  | Bank 0      |
| 0  | 0  | 0  | 0  | 0  | 0  | 0  | 1  | Bank 1      |
| 0  | 0  | 0  | 0  | 0  | 0  | 1  | 0  | Bank 2      |
| 0  | 0  | 0  | 0  | 0  | 0  | 1  | 1  | Bank 3      |
| 0  | 0  | 0  | 0  | 0  | 1  | 0  | 0  | Bank 4      |
| 0  | 0  | 0  | 0  | 0  | 1  | 0  | 1  | Bank 5      |
| 0  | 0  | 0  | 0  | 0  | 1  | 1  | 0  | Bank 6      |
| 0  | 0  | 0  | 0  | 0  | 1  | 1  | 1  | Bank 7      |

In addition, the following exemplary table shows values to indicate the failed (or target) bank or bank group. The exemplary table shows only up to Bank 7, but may support multiple banks to support the future memory architectures (e.g., up to 64 banks).

TABLE 4

| T7 | T6 | T5 | T4 | T3 | T2 | T1 | T0 | Chip Select |
|----|----|----|----|----|----|----|----|-------------|
| 0  | 0  | 0  | 0  | 0  | 0  | 0  | 0  | Bank 0      |
| 0  | 0  | 0  | 0  | 0  | 0  | 0  | 1  | Bank 1      |
| 0  | 0  | 0  | 0  | 0  | 0  | 1  | 0  | Bank 2      |
| 0  | 0  | 0  | 0  | 0  | 0  | 1  | 1  | Bank 3      |
| 0  | 0  | 0  | 0  | 0  | 1  | 0  | 0  | Bank 4      |
| 0  | 0  | 0  | 0  | 0  | 1  | 0  | 1  | Bank 5      |
| 0  | 0  | 0  | 0  | 0  | 1  | 1  | 0  | Bank 6      |
| 0  | 0  | 0  | 0  | 0  | 1  | 1  | 1  | Bank 7      |

Tables 3 and 4 may be expanded to show more banks or bank groups, depending on the application. In block 310, the failed bank or bank group is powered down by a mode register command, such as a command setting values for A7 and A8 as shown above. In block 312, the sparing operation ends.

Figure 4:
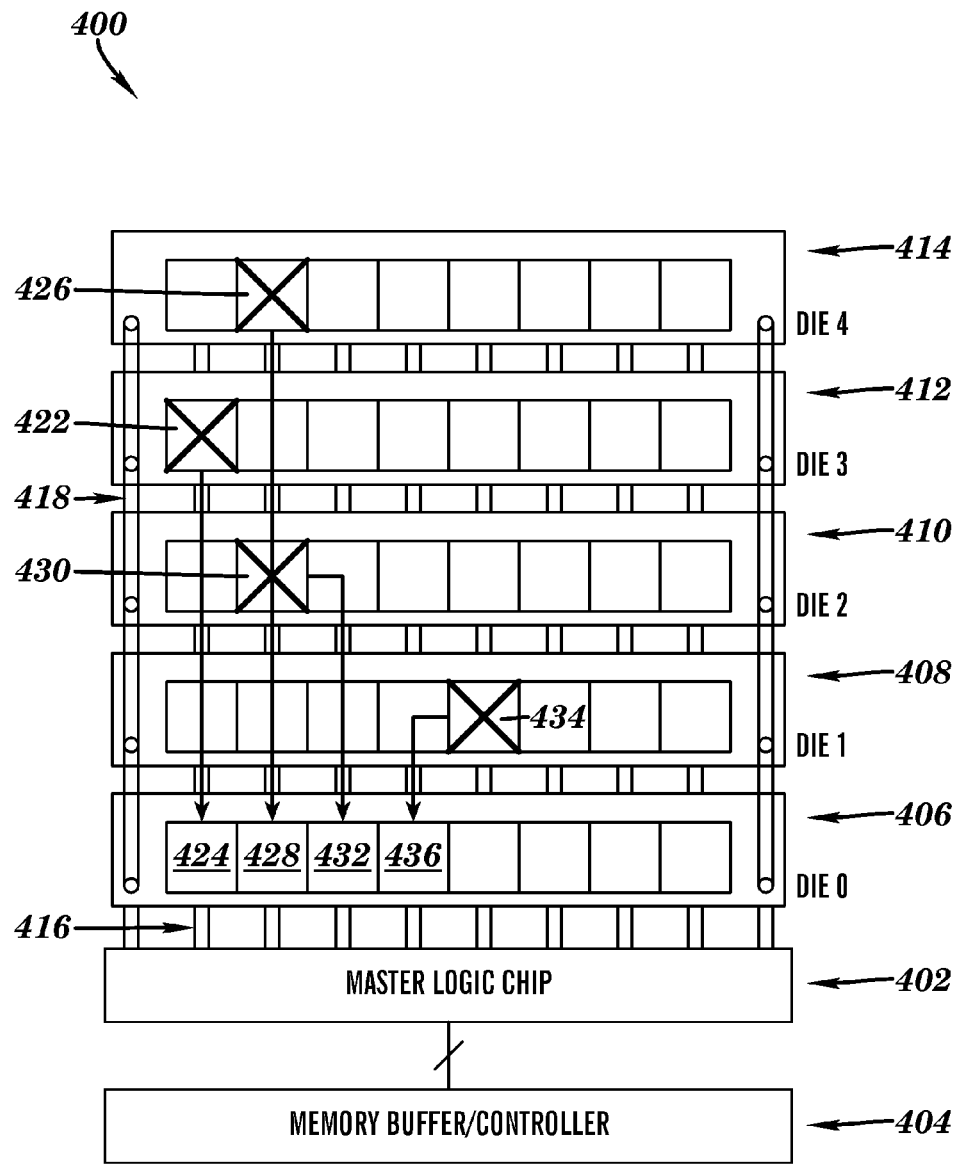
FIGS. 4-5 are block diagrams of exemplary 3D memory systems configured to perform a sparing operation in accordance with embodiments.

FIG. 4 is a diagram of an exemplary 3D memory system or device 400 utilizing a bank or bank group sparing process according to an embodiment. In an embodiment, the memory device 400 includes TSV DRAM having five dies stacked together where each die corresponds to a rank. As depicted, the top four dies have associated chip selects. A master logic chip 402 and memory controller 404 communicate and control the device. A rank 406 corresponds to die 0, rank 408 corresponds to die 1, rank 410 corresponds to die 2, rank 412 corresponds to die 3 and rank 414 corresponds to die 4. Each of the ranks include a plurality of banks. In an embodiment, the banks may be grouped into bank groups for communication and operation of the device. As discussed herein, sub-units of the ranks are referred to as elements, where each element may represent a bank or a bank group, depending on the 3D memory device 400 configuration. In embodiments, the ranks include a plurality of bank groups, where each bank group includes a plurality of banks. In one embodiment, the rank 406 does not have an associated chip select, as it is configured to be a spare rank or die during production of the memory device. Accordingly, ranks 408, 410, 412 and 414 each have associated chip selects to enable active use of the ranks during operation. In embodiments, a master chip 402 has in-built logic to perform memory mapping during memory system run-time (i.e., dynamic or run time sparing) or in manufacturing mode (i.e., when the module is being manufactured). Accordingly, because of the logic in the master chip 402, the memory mapping is transparent to the memory controller and would enable the usage of a spare bank or bank group instead of the failed bank or bank group during run time or during system initialization. As depicted, the 3D memory device 400 includes TSVs, such as TSV supply voltage 418 and TSV ground 420, used for signal transmission.

In an exemplary embodiment, if any of the banks in ranks 408, 410, 412 or 414 incurs soft errors or exceeds the error threshold during system run time, then the failed bank or the bank group including the failed bank is replaced by any of the banks or bank groups of spare rank 406. In the example, the master logic chip 402 identifies which banks are failed because the memory controller 404 request for the master logic chip 402 would cause an attempt to activate or precharge the banks, thus determining that the banks are failed. For example, the master logic chip 402 would learn that elements 422, 426, 430 and 434 are failed, where the elements are banks or bank groups. Accordingly, by using MR commands, the master logic chip 402 intelligently uses elements 424, 428, 432 and 436 of the spare die 0 in place of the failed elements. In embodiments, elements 424, 428, 432 and 436 are banks or bank groups, depending on the configuration of the 3D memory device 400. In an embodiment of 3D memory device 400, any element of spare rank 406 may be used as a spare for any element of ranks 408, 410, 412 and 414. Thus, the sparing arrangement provides improved reliability, flexibility and performance for memory systems.

In embodiments, during the sparing process the memory controller 404 requests a spare element inside the TSV DRAM stack through mode register commands, such as those commands described above. The master logic chip 402 responds affirmative that elements 424, 428, 432 and 436 are available. In embodiments, one of the elements selected to be the spare is then powered up. In an embodiment, the failed element may be powered down if all the banks and bank groups are failed in the chip after the logic chip maps the failed bank or bank groups to the spare bank or bank groups of a spare rank or a deconfigured rank of banks or bank groups, thus conserving energy. Then mapping within the master logic chip 402 maps the spare element to replace the failed element and the memory controller 404 is able to use the spare element as a replacement. In an embodiment, after replacement of the failed element by the spare element using the mapping and mode register commands along with logic in the master logic chip 402.

Figure 5:
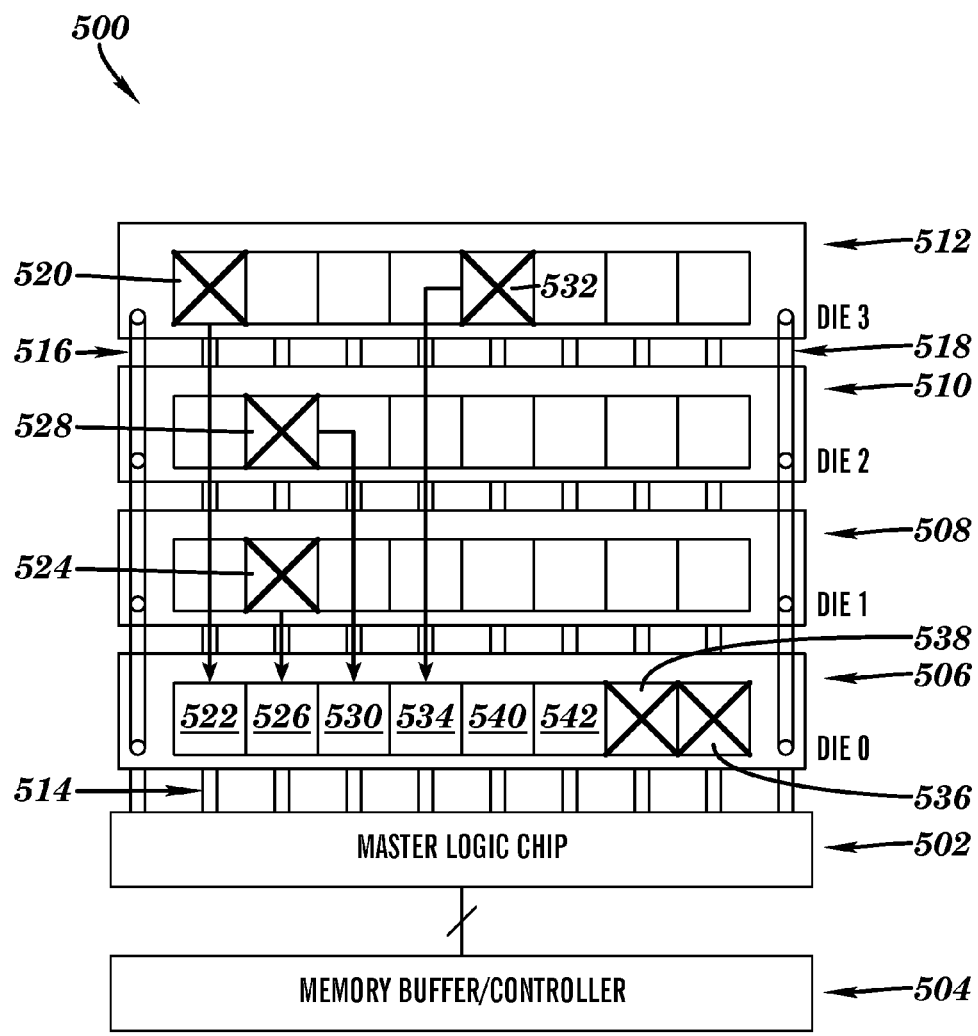

FIG. 5 is a block diagram of an exemplary 3D memory system or device 500 configured to perform an exemplary sparing operation. In an embodiment, the memory device 500 includes TSV DRAM having four dies stacked together where each die corresponds to a rank or chip select. A master logic chip 502 is configured to communicate and map communications with the dies. A memory controller 504 is coupled to and controls the memory device 500. In the exemplary memory device 500, no ranks are initially configured as a spare rank and each rank has an associated chip select. In an embodiment, the memory controller 504 requests a spare rank via a mode register command and the master logic chip 502 confirms there is no spare rank. A rank may be designated as a spare rank based on any suitable criteria, such as multiple errors within the rank. In a case where a rank 506 experiences a plurality of failures, the rank 506 is de-configured or taken offline, where the operational elements (banks or bank groups) within the rank are available as spares. As depicted, elements 522, 526, 530 and 534 are used as spares while failed elements 536 and 538 are disabled from sparing. Elements 540 and 542 are also available as spares. In an example, when elements 520 and 532 of rank 512 have an errors, the memory controller 504 requests to use a elements 522 and 534, respectively of rank 506 instead of the failed elements by mapping the communications in the master logic chip 502. In addition, failed elements 524 and 528 are replaced by spare elements 526 and 530, respectively. In an example, the master logic chip 502 identifies which banks are failed because the memory controller 504 request for the master logic chip 502 would cause an attempt to activate or pre-charge the banks, thus determining that the banks are failed. As depicted, the spare banks or bank groups 530 and 534 are not located in the same chip column of the 3D memory device as the failed banks or bank groups 528 and 532, respectively, thus providing flexibility in the sparing process.

Accordingly, the depicted arrangement effectively utilizes memory space inside in the 3D memory device 500 in case of failure and de-configuration of a single rank by using functional elements as spares within a de-configured rank. For example, during run time, if there is an unrecoverable error (UE) on any one of the DRAM in a rank then that rank will be de-configured and the elements (e.g., DRAMs in that banks/bank group) in the rank can be used as a spare bank pool. In embodiments, the de-configured or spare rank remains powered on.

In an embodiment, the sparing process permits memory devices to have separate activation, read, write or refresh operations underway in each of the unique bank groups. This concept will improve overall memory efficiency and bandwidth, especially when small memory granularities are used.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for bank sparing in a 3D memory device having a plurality of ranks, each rank having a plurality of banks, the method comprising:
   detecting, by a memory controller, a first error in the 3D memory device;
   detecting, by the memory controller, a second error in a first element in a first rank of the 3D memory device, wherein the first element in the first rank has an associated first chip select;
   sending a command from the memory controller to the 3D memory device to set mode registers in a master logic portion of the 3D memory device that enable a second element to receive communications directed to the first element based on detecting the second error, wherein the second element is in a second rank of the 3D memory device, the second rank is a spare rank that does not have an associated chip select that is addressable by the memory controller, and wherein the first element and second element are each either a bank or a bank group; and
   correcting the first error using an error control code.

2. The method of claim 1, further comprising:
placing the first element into a low power mode based on enabling the second element.

3. The method of claim 1, wherein the second element is verified as properly functioning and wherein the second rank is de-configured due to a failure of a third element in the second rank.

4. The method of claim 1, wherein sending the command from the memory controller to the 3D memory device comprises updating a table in a master logic chip in the 3D memory device to map the second element to receive communications directed to the first element.

5. The method of claim 1, wherein sending the command from the memory controller to the 3D memory device comprises sending the command while the memory device remains powered up to provide dynamic sparing during run time operation for the 3D memory device.

6. The method of claim 1, wherein detecting the second error in the first element in the first rank of the 3D memory device comprises detecting a hard or soft error in the first element and wherein enabling the second element to receive communications directed to the first element corrects the second error for the 3D memory device, the second error being a hard or soft error.

7. A method for bank sparing in a 3D memory device having a plurality of ranks, each rank having a plurality of elements, the method comprising:
detecting, by a memory controller, an error in the 3D memory device during run time operation, the error being in a first element in a first rank of the 3D memory device, wherein the first element has an associated first chip select;
identifying a second element in a second rank of the 3D memory device, the second element operating properly; and
sending a command from the memory controller to the 3D memory device during run time operation to set mode registers in a master logic portion of the 3D memory device that enable the second element to receive communications directed to the first element, wherein the first element and second element are each either a bank or a bank group comprising a plurality of chips, and the second rank is a spare rank that does not have an associated chip select that is addressable by the memory controller.

8. The method of claim 7, further comprising:
placing the first element into a low power mode based on enabling the second element.

9. The method of claim 7, wherein a second bank is verified as properly functioning and wherein the second rank is deconfigured due to a failure of a third bank in the second rank.

10. The method of claim 7, wherein sending the command from the memory controller to the 3D memory device comprises updating a table in a master chip in the 3D memory device to map the second element to receive communications directed to the first element.

11. The method of claim 7, wherein sending the command from the memory controller to the 3D memory device comprises sending the command while the memory device remains powered up to provide dynamic sparing during run time operation for the 3D memory device.

12. The method of claim 7, wherein the second element is located in a chip column of the 3D memory device that does not include the first element.

13. A computer program product for operating a 3D memory device having a plurality of ranks, each rank having a plurality of elements, the computer program product comprising:
a non-transitory tangible storage medium readable by a processing circuit and storing instructions for execution by the processing circuit for performing a method comprising:
detecting an error in the 3D memory device during run time operation,
the error being in a first element in a first rank of the 3D memory device, wherein the first element has an associated first chip select;
identifying a second element in a second rank of the 3D memory device, the second element operating properly; and
sending a command from a memory controller to the 3D memory device during run time operation to set mode registers in a master logic portion of the 3D memory device that enable the second element to receive communications directed to the first element, wherein the first element and second element are each either a bank or a bank group comprising a plurality of chips and the second rank is a spare rank that does not have an associated chip select that is addressable by the memory controller.

14. The computer program product of claim 13, further comprising:
placing the first element into a low power mode based on enabling the second element.

15. The computer program product of claim 13, wherein a second bank is verified as properly functioning and wherein the second rank is deconfigured due to a failure of an element in the second rank.

16. The computer program product of claim 13, wherein sending the command from the memory controller to the 3D memory device comprises updating a table in a master chip in the 3D memory device to map the second element to receive communications directed to the first element.

17. The computer program product of claim 13, wherein sending the command from the memory controller to the 3D memory device comprises sending the command while the memory device remains powered up to provide dynamic sparing during run time operation for the 3D memory device.

18. A system for operating a memory system, the system comprising:
a memory controller and a 3D memory device having a plurality of ranks, each rank having a plurality of elements, the system configured to perform a method comprising:
detecting an error in the 3D memory device during run time operation,
the error being in a first element in a first rank of the 3D memory device, wherein the first element has an associated first chip select;
identifying a second element in a second rank of the 3D memory device, the second element operating properly;
sending a command from a memory controller to the 3D memory device during run time operation to set mode registers in a master logic portion of the 3D memory device that enable the second element to receive communications directed to the first element, wherein the first element and second element are each either a bank or a bank group comprising a plurality of chips; and
placing the first element into a low power mode based on enabling the second element.

19. The system of claim 18, wherein the second rank is one of: a spare rank that does not have an associated chip select that is addressable by the memory controller or verified as a properly functioning rank and wherein the second rank is de-configured due to a failure of an element in the second rank.

20. The system of claim 18, wherein sending the command from the memory controller to the 3D memory device comprises updating a table in a master chip in the 3D memory device to map the second element to receive communications directed to the first element.

* * * * *